United States Patent
Gotwals et al.

(10) Patent No.: US 7,589,535 B2
(45) Date of Patent: Sep. 15, 2009

(54) NETWORK DEVICE DETECTION USING FREQUENCY DOMAIN REFLECTOMETER

(75) Inventors: Michael D. Gotwals, Greenwood, IN (US); Robert J. Flask, New Palestine, IN (US); Walter Miller, Bargersville, IN (US)

(73) Assignee: Acterna LLC, Germantown, MD (US)

( * ) Notice: Subject to any disclaimer, the term of this patent is extended or adjusted under 35 U.S.C. 154(b) by 142 days.

(21) Appl. No.: 11/762,199

(22) Filed: Jun. 13, 2007

(65) Prior Publication Data
US 2007/0290693 A1      Dec. 20, 2007

Related U.S. Application Data

(60) Provisional application No. 60/805,117, filed on Jun. 19, 2006.

(51) Int. Cl.
*G01R 31/11* (2006.01)
*G01R 31/02* (2006.01)

(52) U.S. Cl. ............ 324/533; 324/539; 324/534

(58) Field of Classification Search .......... 324/533
See application file for complete search history.

(56) References Cited

U.S. PATENT DOCUMENTS

| | | | |
|---|---|---|---|
| 5,050,093 A * | 9/1991 | Reddy et al. | 702/36 |
| 5,949,236 A * | 9/1999 | Franchville | 324/533 |
| 5,994,905 A | 11/1999 | Franchville et al. | |
| 6,177,801 B1 | 1/2001 | Chong et al. | |
| 6,466,649 B1 | 10/2002 | Walance et al. | |
| 6,959,037 B2 | 10/2005 | Bailey et al. | |
| 7,071,700 B2 | 7/2006 | Gorka et al. | |
| 7,120,563 B2 * | 10/2006 | Bechhoefer et al. | 702/189 |
| 7,171,322 B2 * | 1/2007 | Taylor | 702/106 |
| 2004/0073395 A1 * | 4/2004 | Furse et al. | 702/108 |

* cited by examiner

*Primary Examiner*—Timothy J Dole
*Assistant Examiner*—Jeff Natalini
(74) *Attorney, Agent, or Firm*—Pequignot + Myers LLC; Matthew A. Pequignot

(57) ABSTRACT

A system for identifying elements in a cable network utilizing frequency domain reflectometry includes initial filtering stages to remove noise, second and third harmonics and side lobes, and subsequent identification stages to identify and display various elements, e.g. splitters, barrels and opens, in the cable network and their relative positions.

13 Claims, 6 Drawing Sheets

NETWORK DEVICE DETECTION USING FREQUENCY DOMAIN REFLECTOMETER

CROSS-REFERENCE TO RELATED APPLICATIONS

The present invention claims priority from U.S. Patent Application No. 60/805,117 filed Jun. 19, 2006, which is incorporated herein by reference.

TECHNICAL FIELD

The present invention relates to mapping a cable distribution network, and in particular to the identification and locating of splitters, barrel/splices, low quality splitters and opens in a home coax network utilizing the results from frequency domain reflectometer scans.

BACKGROUND OF THE INVENTION

Fault detection, e.g. locating faults such as breaks, shorts, discontinuities, degraded components, and improperly terminated transmission lines, is a test performed by CATV service providers in order to pinpoint problems in the cable distribution network. Faults within the distribution network are typically characterized by an impedance mismatch, i.e. the impedance of the fault is different than the characteristic impedance of the transmission lines of the distribution network. For example, transmission lines in a CATV distribution subsystem typically have an impedance of approximately 75 ohms; however, a short on the transmission line would have an approximately zero impedance and a break would have an approximately infinite impedance.

One problem with faults in the distribution subsystem is that faults, due to their impedance mismatch characteristics, reflect signals transmitted through the distribution network. As a result, faults in the distribution network may also cause problems throughout the distribution network due to interference from reflected signals. Therefore, it is important for CATV service providers to be able to easily identify and locate faults within the network in order to cure reception problems of a single subscriber and to remove fault generated interference from the distribution network as a whole.

Frequency domain reflectometry utilizes a reflectometer that applies a sweep signal to a distributed communication network. The sweep signal is an RF signal that is swept from an initial frequency to a final frequency, e.g. 5 MHz to 82 MHz, in relatively small increments, e.g. 0.075 MHz. If an impedance mismatch exists within the network the impedance mismatch will reflect each transmitted signal back to the reflectometer at the same frequency as the transmitted signal, but retarded in phase. As a result of this reflection, a standing wave is generated. The reflectometer measures the level of the standing wave at each swept frequency in order to obtain a reflected sweep response signal. The retardation of the reflected sweep response signal is such that the minimums of the reflected wave will align to ½ the wavelength of the impedance mismatch from the reflectometer. Due to this known relationship, the reflectometer may determine the distance from the reflectometer to the impedance mismatch.

Frequency domain reflectometry (FDR) systems have been used to test networks, such as the one disclosed in U.S. Pat. No. 5,994,905, issued Nov. 30, 1999 to Franchville; U.S. Pat. No. 6,177,801, issued Jan. 23, 2001 to Chong; U.S. Pat. No. 6,466,649, issued Oct. 15, 2002 to Walance et al; U.S. Pat. No. 6,959,037, issued Oct. 25, 2005 to Bailey et al; and U.S. Pat. No. 7,071,700, issued Jul. 4, 2006 to Gorka et al.

Unfortunately, the results of previous FDR systems are typically displayed as a simple graph with distance on the X-axis and reflection amplitude on the Y-axis. The graphical results include several false readings, e.g. harmonics and erroneous reflections, and require a great deal of interpretation by a technician. Filtering processes have been utilized to cut down on the anomalies, but the results are still prone to interpretation errors and there is no definitive means of determining what kind of device is causing each reflection.

An object of the present invention is to overcome the shortcomings of the prior art by providing a system that utilizes the raw data to identify devices in a cable network, such as splitters, bad barrels as well as cables that are open or shorted, and that displays the results in a tabular format with a description of the device type and their distance from the test location.

SUMMARY OF THE INVENTION

Accordingly, the present invention relates to a method of identifying elements in a cable network comprising the steps of:

a) performing a frequency domain reflectometer sweep of the cable network generating raw data with a plurality of reflections, each reflection having a peak value;

b) removing all reflections having a peak value less than a predetermined peak threshold value;

c) determining and removing second and third harmonic reflections;

d) determining and removing side lobe reflections to generate filtered data;

e) determining which reflections in the filtered data represent unterminated cables by comparing the peak values with a predetermined open threshold value;

f) determining type and position of any splitters in the cable network from the filtered data;

g) determining position of any barrels in the cable network from the filtered data; and h) displaying the type and position of the unterminated cables, the splitters and the barrels.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
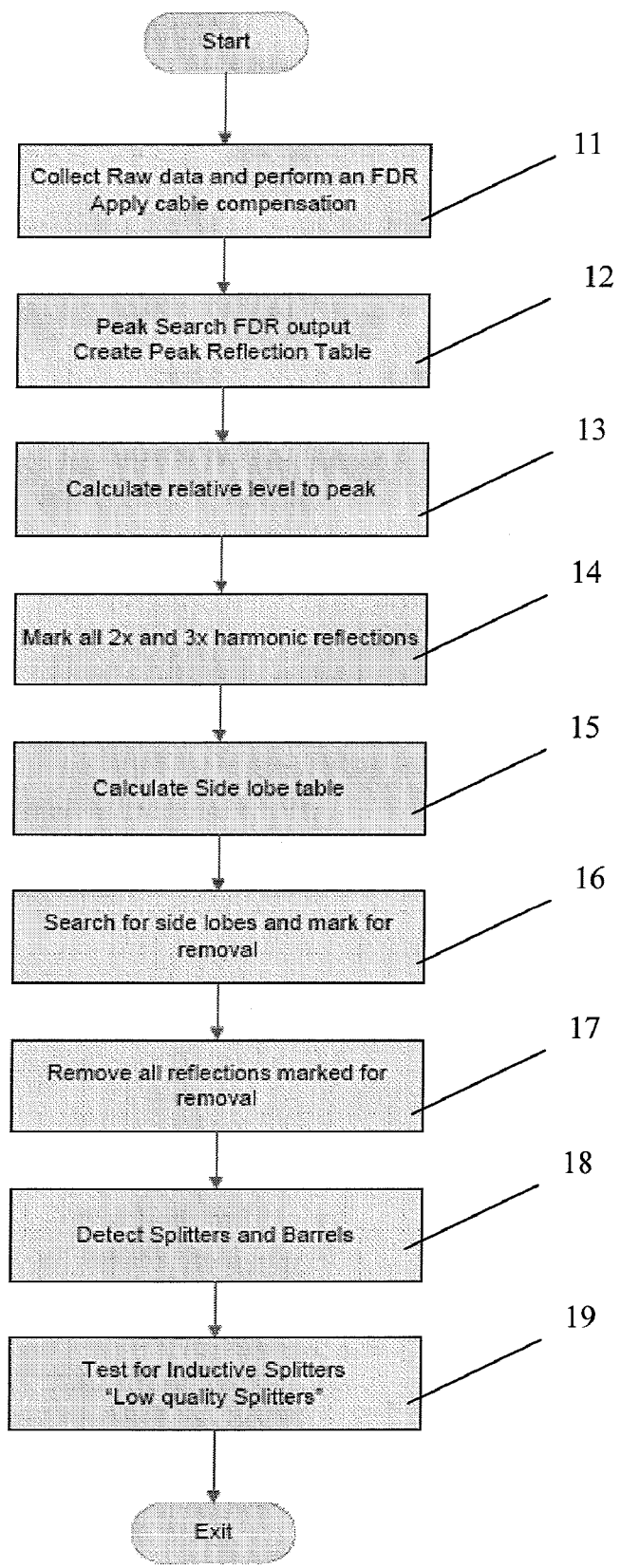
FIG. 1 is a flow chart illustrating the steps in a cable network identification system according to the present invention.

With reference to FIG. 1, the initial step 11 in accordance with the present invention is to perform a frequency domain reflectometer (FDR) sweep of a cable network 20 (FIG. 2) to be tested, and collect raw data indicative of the elements in the network. Accordingly, a technician with an FDR testing device 1 in accordance with the present invention connects into the network 20 to be tested at a suitable location, e.g. a network interface device (NID) 21, transmits an FDR test signal, and receives the raw data response signal. The FDR testing device 1 according to the present invention includes RF generating hardware 2 necessary to launch the FDR test sweeps, e.g. a 5 MHz to 155 MHz signal in increments of 0.29 MHz, an input/output port 3 for launching the RF test signals and receiving the reflected test signals, and a microprocessor 6 for controlling all of the aforementioned system, as well as other testing systems. Memory for storing and running the control software for the FDR testing device 1, as well as for storing and executing the control software for the network mapping system is provided with the microprocessor 6. A signal converter 4 converts the returning RF signals to electrical signals, which are converted to digital signals utilizing an analog to digital converter (ADC) therein. A display screen 5 for detailing the different types of elements in the network and their distances from the test location is also provided.

Figure 2:
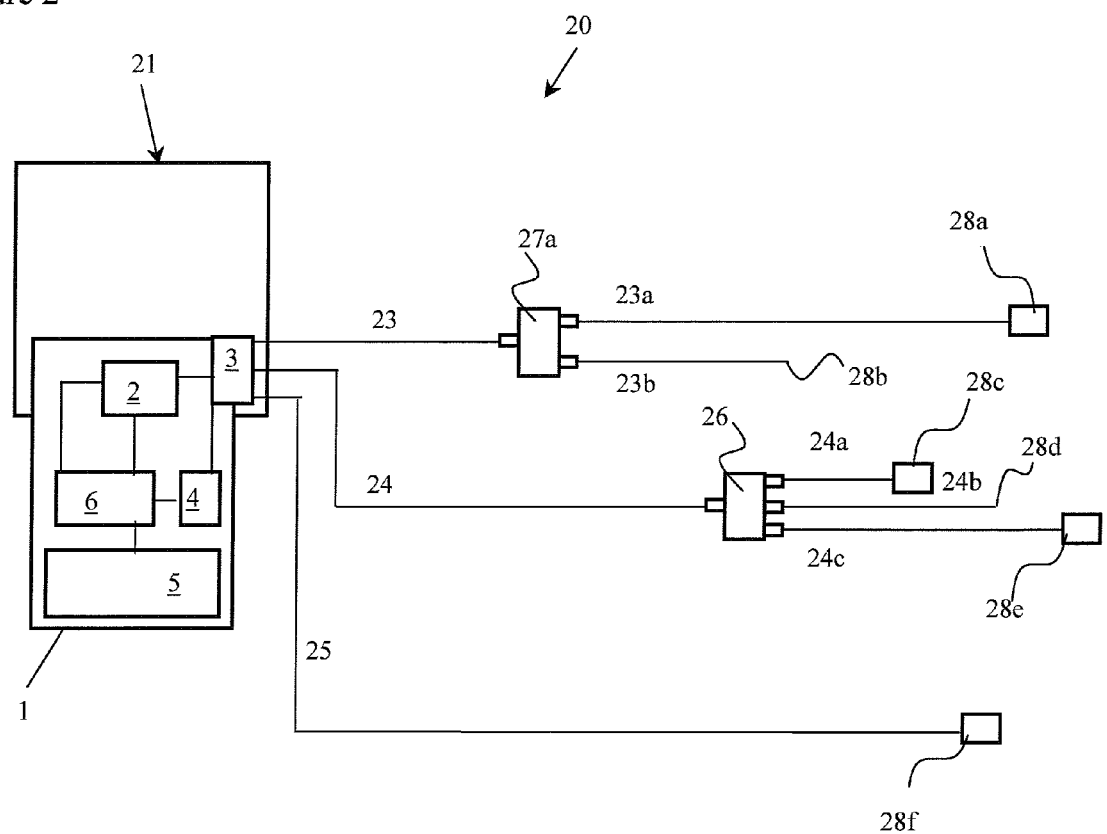
FIG. 2 is a schematic diagram of a cable network.

With reference to FIG. 2, a home network 20 is illustrated extending from a network interface device (NID) 21 to three main branches 23 to 25, two of which divide into five sub-branches 23a, 23b, 24a, 24b, 24c via a high quality splitter 26 and a low quality splitters 27. Each of the sub-branches is either terminated in a barrel 28a, 28c, 28e, 28f or is unterminated, as at 28b and 28d. In use, a technician positions themselves at the NID 21 located inside or outside the house or building, and performs an FDR test by initiating a FDR sweep by the RF generating hardware 2.

Figure 3:
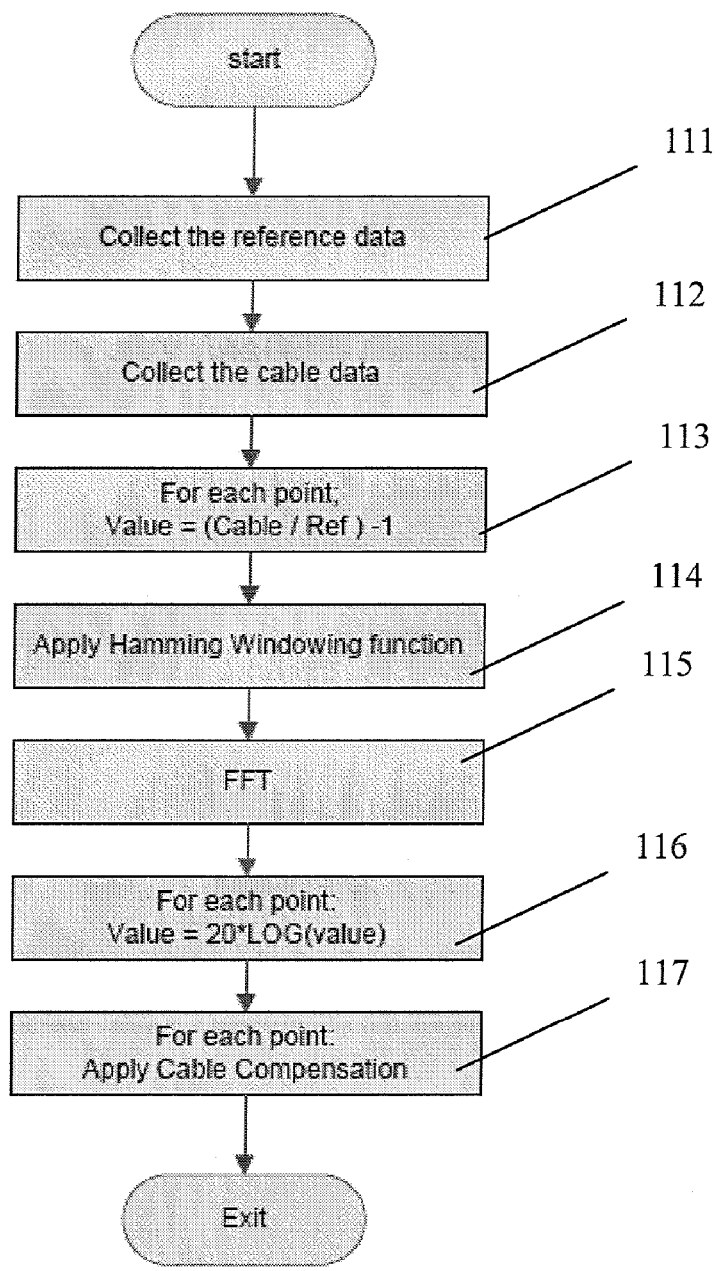
FIG. 3 is a flow chart illustrating the steps involved in the first step of FIG. 1.

With reference to FIG. 3, the first step 11 from FIG. 1 initially includes the collection of reference data, step 111, which are representative of the strength of a reference sweep signal from the RF generating hardware 2 at each swept frequency with only a predetermined resistive load connected, e.g. a 75 ohm resistive load, but without the distribution network connected. The ADC 4 converts the reference data for storage in the memory of microprocessor 6. A plurality of measurements can be taken for each increment in the reference sweep signal to establish optimum, e.g. average, reference values.

Cable or test data is collected in step 112, which involves the RF generating hardware 2 launching one or more test sweeps into the cable network 20, and recording the return signals in memory via the converter 4. Step 113 involves calculating a reflected sweep response level for each point by dividing the test value by the reference value and subtracting 1. In step 114, a windowing technique, e.g. a Hamming Window, is applied to the values calculated in step 113, followed by a fast Fourier transform (FFT) in step 115. In step 116, the magnitude of the return loss for each point is calculated, i.e. Return Loss=20×LOG(value), and then in step 117 cable compensation is applied for each Return Loss value. A separate attenuation compensation factor is determined for each spectral peak of the spectrum, based on the specific cable and the distance traveled, which is multiplied by the magnitude of each spectral peak in order to obtain a reflected sweep response spectrum that has been compensated for attenuation. This process is detailed in U.S. Pat. No. 5,994,905 issued Nov. 30, 1999 in the name of Wavetek Corporation, which is incorporated herein by reference.

The second step 12, in FIG. 1, involves performing a peak search of the raw data to identify and isolate all of the points which have an amplitude greater than a predetermined threshold, e.g. −25 dBrl. The peak search does not only eliminate the points below −25 dBrl, but also data points that may be greater than −25 dBrl on either side of a higher peak, thereby eliminating the case in which a single peak has many points >−25 dBrl The highest peak is also identified for determining relative peak levels for each of the other saved peaks, as hereinafter discussed. All of the peaks meeting the aforementioned criteria are found and stored in a Peak Reflection Table along with corresponding information related thereto, e.g. distance to the point, reflected power level (dBrl), width of peak, normalized distance to the point, and the relative level to the highest saved peak. Normalized distance is the FFT x-axis indexes 0-255 prior to being converted to distance (ft). Normalized distances are much easier to use than the floating point distances that result from the conversion to length units, enabling comparisons to be made without considering other factors, e.g. to determine if a reflection is a 2× reflection, you divide it by two, subtract it from another reflection, take the absolute value and then compare to see if the answer is <=1. If the value had been converted to feet, the comparison would be dependant on the velocity of propagation (VOP). The distance D can be calculated from the equation $D=f_R \times c \times V_{OP}$ wherein $f_R$ is the frequency of the peak, c is the speed of light, and $V_{OP}$ is the velocity of propagation.

In the third step 13, the relative levels of all of the peaks found in the second step are determined relative to the highest peak. The relative levels are used to compare reflections in a subsequent step.

Second and third harmonic reflections are found and marked for removal in the fourth step 14. The second harmonic reflection can be identified by a peak, which is greater than 10 dB lower and within ±1 normalized counts of a peak proximate thereto. The third harmonic reflection can be identified by a peak, which is greater than 20 dB lower and within ±1 normalized counts of a peak proximate thereto.

A table of side lobes to be removed is produced in the fifth step 15, by first creating a list of potential side lobe producers by determining all reflection peaks that are greater than a minimum side lobe producer level, e.g. >−20 dBrl, and that have not already been marked as second or third harmonic reflections. A table of potential side lobe distances is created by adding and subtracting all of the distances of the reflections marked as side lobe producers. The remaining reflections are searched to determine if any have the same normalized distance as any of the calculated side lobes. If any of the reflections do have the same normalized distance as a calculated side lobe, a verification step is conducted to ensure that the level of the reflection is less than either of the two side lobe producers that may have created it. A reflection is marked for removal in the sixth step 16, if the reflection meets all of the aforementioned criteria. The side lobe table includes a normalized distance and a level. The side lobes consist of the sum and difference of the normalized distances for all reflections deemed as a side lobe producer. Each side lobe is also assigned a level that is equal to the level of the lower of its two parents level. Typically side lobes are <−15 dBrl, within ±1 normalized length units, and lower in level than the calculated side lobe.

The seventh step 17 comprises removal of all of the reflection peaks that have been marked for removal, i.e. the second and third harmonics and the side lobes.

Figure 4:
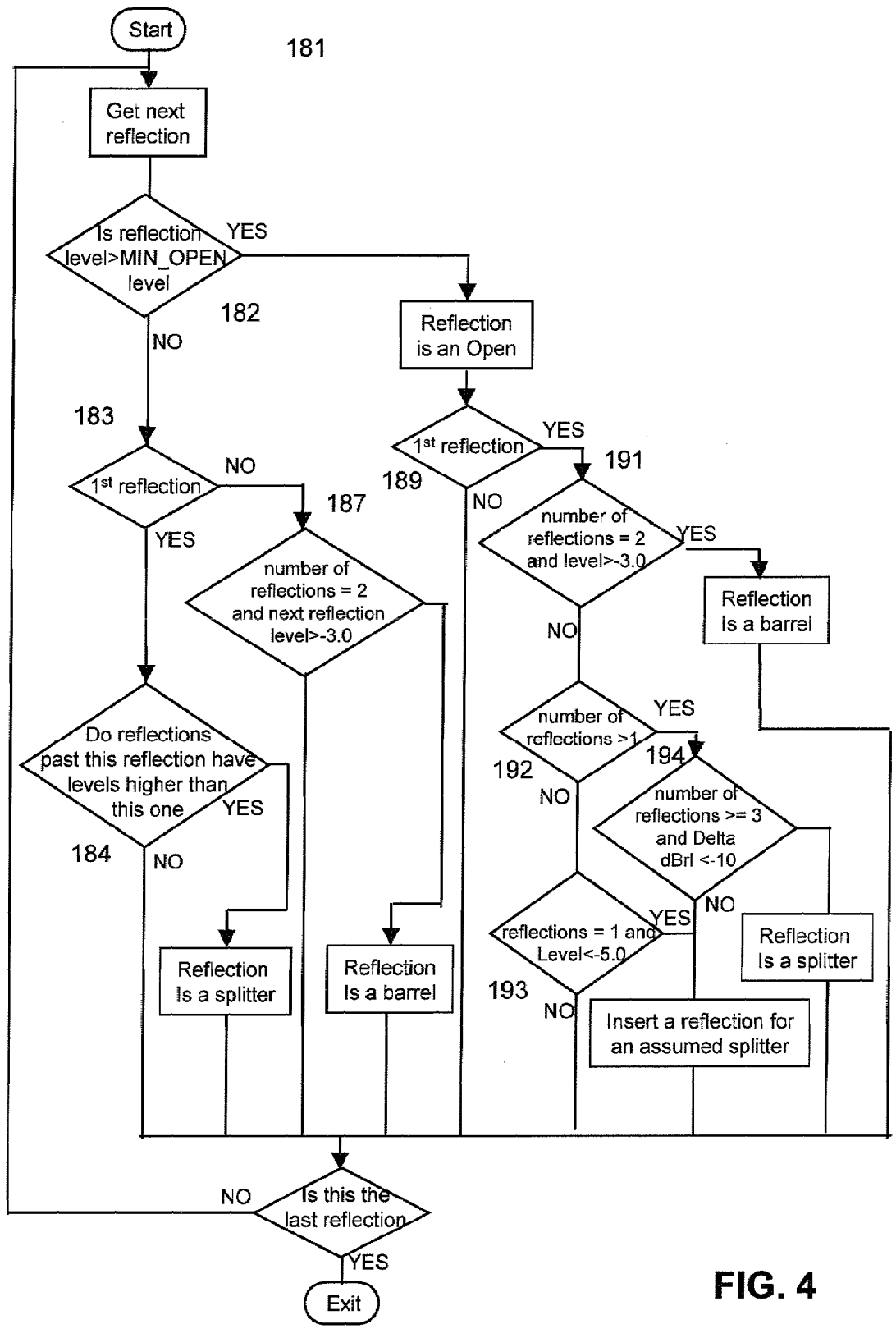
FIG. 4 is a flow chart illustrating the steps involved in the final steps of FIG. 1.

The eighth and ninth steps 18 and 19, respectively, relate to the identification of open or unterminated cables, and the specific identification of elements, such as barrels, higher quality splitters and lower quality splitters, which will be detailed further with reference to FIGS. 4 and 5. Unterminated or open cables can be identified by large reflection peaks; however, the threshold for open cables needs to be distance dependent, if not previously compensated for, since cable loss will attenuate a reflection the farther the reflection is from the test equipment. Splitters have a unique signature depending on the number of ports and the way the ports are terminated. Higher quality splitters will produce high return loss, e.g. a small reflection with N reflections to follow, the N corresponding to the number of ports on the splitter. The algorithm of the present invention searches the reflections looking for a collection of signatures that are based on common network topologies. For example a 2-splitter can be identified by low level first reflection and two larger reflection at greater distances.

Figure 5B:
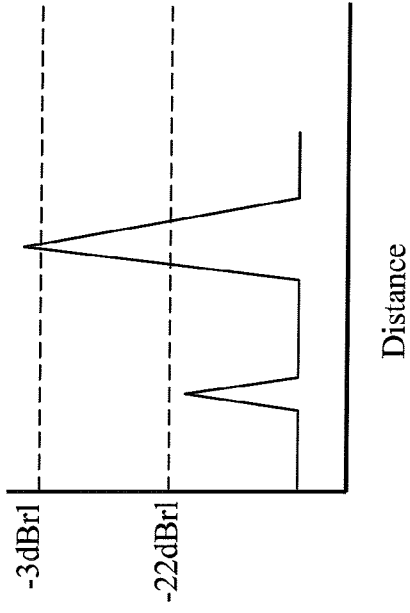
FIGS. 5b and 5d illustrate graphical representations of barrels.
Figure 5D:
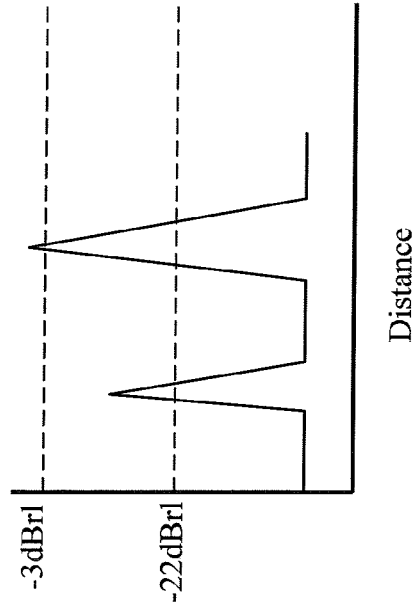
Figure 5A:
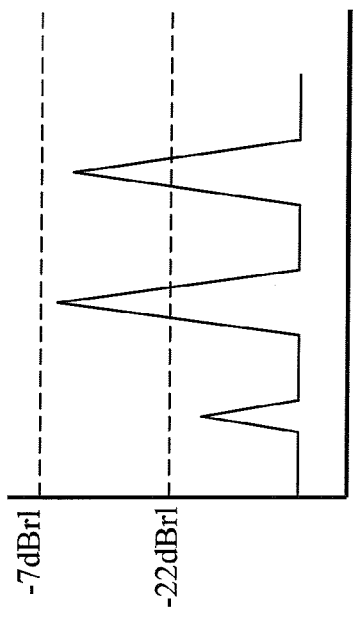
FIGS. 5a and 5c illustrate graphical representations of two-port splitters.
Figure 5C:
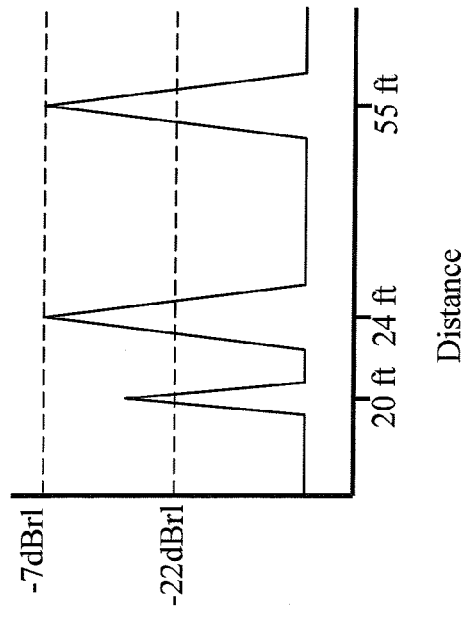

Example illustrated in FIG. 5c

| 20 ft | −20 dbrl | splitter |
| 24 ft | −7.0 dbrl | open |
| 55 ft | −7.0 dbrl | open |

FIG. 4 illustrates the steps and algorithm undertaken in the eighth step 18 for detecting splitters and barrels. In the initial step 181, the next reflection to be examined is obtained from the response spectrum. The second step 182 involves determining whether the reflection peak is greater than a predetermined Open threshold value, e.g. −22 dBrl, which is indicative of an open or unterminated cable. If the reflection is not above the Open threshold value, i.e. the second step 182 results in a NO answer, then a subsequent determination is made at decision box 183 whether the reflection is the first reflection of a series. If the reflection is the first in a series, then a determination is made at decision box 184 as to whether reflections after the reflection in question are higher. If the answer is NO, then the process passes to final determination step 186, which halts the process if the reflection in question is the last reflection or returns to step 181, if the reflection in question is not the last reflection. If the answer at decision box 184 is YES, i.e. the reflections after the reflection in question have higher levels, but less than −7 dBrl, then the reflection in question is indicative of a splitter (See FIG. 5a), and the process proceeds to the final determination step 186.

If the answer at decision box 183 is NO, i.e. the reflection in question is not the first reflection in a series, then the process proceeds to decision box 187, wherein a determination is made as to whether there are two reflections in a row and whether the next reflection is greater than −3.0 dBrl. If so, then the reflection in question is indicative of a barrel (See FIG. 5b), and the process proceeds to the final determination step 186. If not, then the process proceeds to the final determination step 186, as detailed above.

If the answer at step 182 was YES, i.e. the reflection in question is greater than the Open threshold level, then the reflection in question is indicative of an open, and the process proceeds to decision box 189, which is similar to decision box 183. As above, if the reflection in question is a first reflection, then the process proceeds to the final determination step 186. If the reflection in question is not a first reflection, then the process proceeds to decision box 191, which is similar to decision box 187. As above, if the total number of reflections is two, and if the level of the reflection in question is greater than −3 dB, then the reflection is indicative of a barrel (see FIG. 5d). If the answer at decision box 191 is NO, then the process proceeds to decision box 192 to determine whether the number of reflections is greater than 1. If the number of reflection is 1 and the level is less than −5.0 dB, then a decision is made at decision box 193 to proceed to final determination step 186. If the number of reflections at decision box 192 is greater than 1, then the process proceeds to decision box 194, wherein a determination is made as to whether the number of reflections is greater than or equal to 3, and whether the difference in the reflections level is within −10 dBrl of each other. If the answer is YES, and the levels are less than −7 dBrl, then the reflections in question are indicative of a splitter (see FIG. 5c), and the process proceeds to the final determination step 186. If the answer is No, then the control system begins a deep splitter search process, in which it is assumed that the reflections in question make up the port reflections of a splitter.

If multiple reflections are detected and the dBrl levels are less than −3.0 dBrl with levels having less than a 10 dB difference, it is assumed that a splitter must be present. In the case of a really good splitter, its dBrl may be very low, e.g. −35 dBrl, well below the minimum Open threshold level of −22 dBrl. Accordingly, if the reflections indicate a splitter may be present then an assumed splitter is inserted into the first position of the reflection list and given a level of −99 dBrl, which is well below any realistic reading, and the distance is set to the same distance as the first reflection.

The deep splitter search searches the raw data between FFT distance index 0 and the distance index of the first reflection, because if there is a splitter present it will be found in that area. The deep splitter search looks for peaks down to −40 dBrl, e.g. between −22 dBrl and −40 dBrl. The deep splitter search searches for the largest peak that is not at a side lobe index. Discovery of a low level peak in that area with the aforementioned higher level reflections is indicative of a splitter.

Figure 6A:
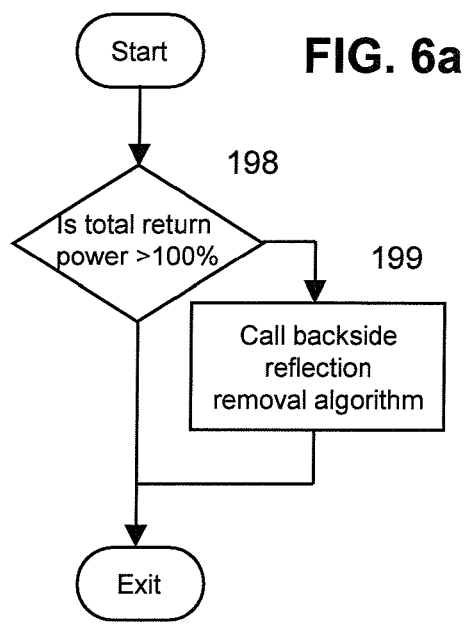
FIGS. 6a and 6b are flow charts illustrating additional steps involved in the final steps of FIG. 1.
Figure 6B:
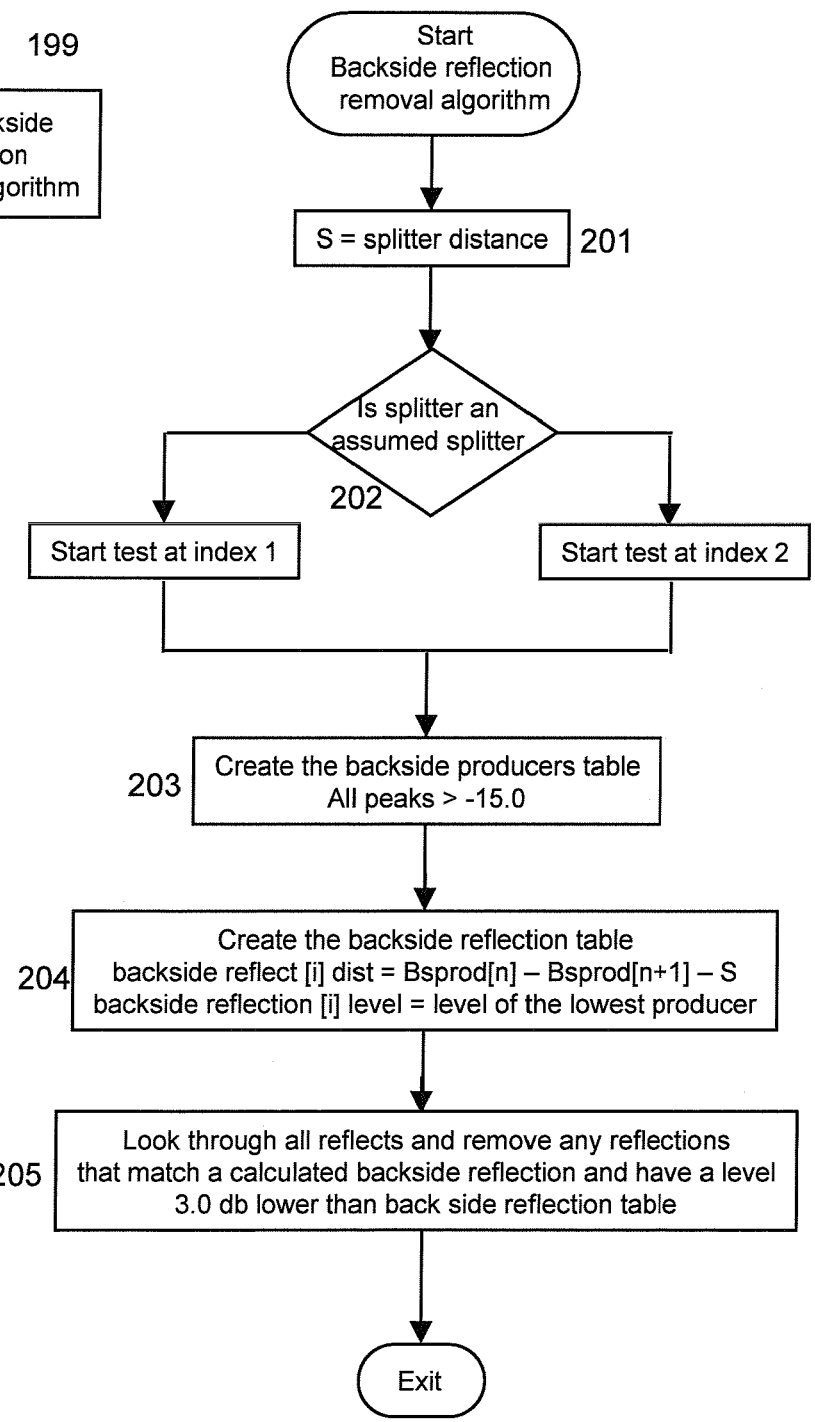

With reference to FIG. 6a, if the total power reflected, calculated by summing up the return loss of all of the open port reflections after a splitter reflection is detected, is greater than 100% then a low quality splitter is present. If a low quality splitter is detected, then a back side reflection removal algorithm, FIG. 6b, is initiated to remove the erroneous reflections.

In a normal scenario a 2-way splitter has three reflections, i.e. from the splitter port, the first open port and the second open port. Since a good splitter has 75 ohm impedance on all ports, the only reflected signals are the three, i.e. the splitter port, the first port open, the second port open. In a bad splitter the ports are not 75 ohms, whereby reflections bounce off the open ports and then off the back side of the splitter port. The result of all these mismatches is an excessive number of reflections, a lot of which are false events. Without detecting this case and removing the back side reflections the results would have false opens displayed. Accordingly, in a preferred embodiment of the present invention, the testing system in the microprocessor 6 conducts a test that detects an excessive number of reflections, and subsequently executes a back side reflection removal algorithm, in the event the reflection test is positive.

The perfect loss less 2-way splitter splits incoming power evenly between the two output ports, i.e. the output on each port would be −3 dB down from the original. The equation is $100 \times 10^{-3/10} = 50\%$, whereby port1 with 50%+port2 with 50%=100%, which will never happen in real circuits.

However, a typical 2-way splitter is approximately 3.5 dB of loss per port or $100 \times 10^{-3.5/10} = 44.7\%$, whereby two ports at 44.7% adds up to 89.3%. Accordingly, less than 100% of the power is accounted for by the splitter losses. When doing this calculation with reflections (dBrl) the equations is $100 \times 10^{dBrl/20}$, in which 20 is 2×10, wherein the 2 accounts for two trips through the splitter.

With a low quality splitter the large reflections from the opens and the back side of the splitter cause the sum of the percentages to exceed 100%, (see step 198 in FIG. 6*a*) which the testing system in the microprocessor 6 uses as an indicator of a low quality splitter, and what triggers the back side reflection removal algorithm 199 to remove the excess reflections.

With reference to FIG. 6*b*, the backside reflection removal algorithm starts at 201 by determining the distance S to the splitter in question. Then a decision is made at 202 whether the splitter is an assumed splitter, in which case the test is started at index 1, or whether the splitter is a detected splitter, in which case the test is started at index 2. The next step 203 is to create a backside reflection producers table of all peaks that are greater than −15.0 dB. Step 204 involves creating a backside reflection table by calculating the backside reflection distance, and the backside reflection level. The final step 205 involves going through all of the reflections and removing any reflections that match a calculated backside reflection distance and have backside reflection level 3.0 dB lower than those on the backside reflection table.

We claim:

1. A method of identifying elements in a cable network comprising the steps of:
    a) performing a frequency domain reflectometer sweep of the cable network generating raw data with a plurality of reflections, each reflection having a peak value;
    b) removing all reflections having a peak value less than a predetermined peak threshold value;
    c) determining and removing second and third harmonic reflections;
    d) determining and removing side lobe reflections to generate filtered data;
    e) determining which reflections in the filtered data represent unterminated cables by comparing the peak values with a predetermined open threshold value;
    f) determining type and position of any splitters in the cable network from the filtered data;
    g) determining position of any barrels in the cable network from the filtered data; and
    h) displaying the type and position of the unterminated cables, the splitters and the barrels
    wherein step f) includes searching the filtered data for a collection of peaks corresponding to a known collection of peaks representative of a splitter; and
    wherein one of the known collection of peaks indicative of a two-way splitter includes a first reflection followed by two larger reflections at different distances.

2. The method according to claim 1, wherein the two larger reflection each have a level between −7 dBrl and the peak threshold value; and wherein the levels of the two larger reflections are within 10 dB of each other.

3. The method according to claim 1, wherein step f) includes determining whether any splitter is a low quality splitter.

4. The method according to claim 3, wherein step f) includes calculating a sum of the percentages of the return loss of the two larger reflections, whereby a sum greater than 100% is indicative of a lower quality splitter.

5. The method according to claim 3, wherein step f) further comprises removing back side reflections, whenever a lower quality splitter is detected.

6. The method according to claim 1, wherein step e) includes determining all reflection peaks greater than a predetermined open threshold value, which is indicative of an open or unterminated cable.

7. The method according to claim 6, wherein the open threshold value is −22 dBrl.

8. The method according to claim 1, wherein step c) comprises:
    identifying second harmonic reflections by a peak, which is greater than 10 dB lower than a peak proximate thereto, and within ±1 normalized counts of the peak proximate thereto;
    identifying third harmonic reflections by a peak, which is greater than 20 dB lower than a peak proximate thereto, and within ±1 normalized counts of the peak proximate thereto; and
    removing the second and third harmonic reflections.

9. A method of identifying elements in a cable network comprising the steps of:
    a) performing a frequency domain reflectometer sweep of the cable network generating raw data with a plurality of reflections, each reflection having a peak value;
    b) removing all reflections having a peak value less than a predetermined peak threshold value;
    c) determining and removing second and third harmonic reflections;
    d) determining and removing side lobe reflections to generate filtered data;
    e) determining which reflections in the filtered data represent unterminated cables by comparing the peak values with a predetermined open threshold value;
    f) determining type and position of any splitters in the cable network from the filtered data;
    g) determining position of any barrels in the cable network from the filtered data; and
    h) displaying the type and position of the unterminated cables, the splitters and the barrels;
    wherein step f) includes searching the filtered data for a collection of peaks corresponding to a known collection of peaks representative of a splitter; and
    wherein one of the known collection of peaks indicative of a three-way splitter includes a first reflection followed by three larger reflections at different distances.

10. A method of identifying elements in a cable network comprising the steps of:
    a) performing a frequency domain reflectometer sweep of the cable network generating raw data with a plurality of reflections, each reflection having a peak value;
    b) removing all reflections having a peak value less than a predetermined peak threshold value;
    c) determining and removing second and third harmonic reflections;
    d) determining and removing side lobe reflections to generate filtered data;
    e) determining which reflections in the filtered data represent unterminated cables by comparing the peak values with a predetermined open threshold value;
    f) determining type and position of any splitters in the cable network from the filtered data;
    g) determining position of any barrels in the cable network from the filtered data; and
    h) displaying the type and position of the unterminated cables, the splitters and the barrels
    wherein step f) includes searching the filtered data for a collection of peaks corresponding to a known collection of peaks representative of a splitter; and
    wherein in step f) if multiple reflections are detected in which their dBrl levels are less than −3.0 dBrl and the multiple reflections have dBrl levels within a 10 dB range, then step f) includes conducting a deep splitter search for a peak less than the predetermined peak threshold value, which along with the multiple reflections are indicative of a splitter.

11. A method of identifying elements in a cable network comprising the steps of:
- a) performing a frequency domain reflectometer sweep of the cable network generating raw data with a plurality of reflections, each reflection having a peak value;
- b) removing all reflections having a peak value less than a predetermined peak threshold value;
- c) determining and removing second and third harmonic reflections;
- d) determining and removing side lobe reflections to generate filtered data;
- e) determining which reflections in the filtered data represent unterminated cables by comparing the peak values with a predetermined open threshold value;
- f) determining type and position of any splitters in the cable network from the filtered data;
- g) determining position of any barrels in the cable network from the filtered data; and
- h) displaying the type and position of the unterminated cables, the splitters and the barrels;

wherein step f) includes searching the filtered data for a collection of peaks corresponding to a known collection of peaks representative of a splitter; and wherein step g) includes searching for a collection of peaks corresponding to a known collection of peaks indicative of a barrel which includes a first reflection followed by a single large reflection at a level greater than −3 dBrl.

12. A method of identifying elements in a cable network comprising the steps of:
- a) performing a frequency domain reflectometer sweep of the cable network generating raw data with a plurality of reflections, each reflection having a peak value;
- b) removing all reflections having a peak value less than a predetermined peak threshold value;
- c) determining and removing second and third harmonic reflections;
- d) determining and removing side lobe reflections to generate filtered data;
- e) determining which reflections in the filtered data represent unterminated cables by comparing the peak values with a predetermined open threshold value;
- f) determining type and position of any splitters in the cable network from the filtered data;
- g) determining position of any barrels in the cable network from the filtered data; and
- h) displaying the type and position of the unterminated cables, the splitters and the barrels;

wherein step a) comprises:
- i) collecting reference data of a predetermined termination resistance at a plurality of frequency points;
- ii) collecting test data at a plurality of frequency points from the cable network;
- iii) calculating a response level for each point based on the reference and cable data;
- iv) fast Fourier transforming the response levels;
- v) calculating a return loss value for each point; and
- vi) applying cable compensation for each point.

13. A method of identifying elements in a cable network comprising the steps of:
- a) performing a frequency domain reflectometer sweep of the cable network generating raw data with a plurality of reflections, each reflection having a peak value;
- b) removing all reflections having a peak value less than a predetermined peak threshold value;
- c) determining and removing second and third harmonic reflections;
- d) determining and removing side lobe reflections to generate filtered data;
- e) determining which reflections in the filtered data represent unterminated cables by comparing the peak values with a predetermined open threshold value;
- f) determining type and position of any splitters in the cable network from the filtered data;
- g) determining position of any barrels in the cable network from the filtered data; and
- h) displaying the type and position of the unterminated cables, the splitters and the barrels;

wherein step d) comprises:
- i) creating a list of potential side lobe producers by determining all reflection peaks that are greater than a minimum side lobe producer level;
- ii) creating a table of potential side lobe distances by adding and subtracting all of the distances of the reflection peaks marked as potential side lobe producers;
- iii) searching remaining reflections to determine if any have the same normalized distance as any of the potential side lobe distances;
- iv) verifying that the reflections found in step iii) to ensure that the level of the reflections are less than either of the two side lobe producers that may have created them; and
- v) removing the side lobe reflections.

* * * * *